(12) United States Patent
Matsuyama

(10) Patent No.: US 6,485,893 B1
(45) Date of Patent: Nov. 26, 2002

(54) RESIST PATTERN FORMING METHOD AND FILM FORMING METHOD

(75) Inventor: Yuji Matsuyama, Kikuyo-Machi (JP)

(73) Assignee: Tokyo Electron Limited, Tokyo (JP)

( * ) Notice: Subject to any disclaimer, the term of this patent is extended or adjusted under 35 U.S.C. 154(b) by 74 days.

(21) Appl. No.: 09/640,277

(22) Filed: Aug. 17, 2000

(30) Foreign Application Priority Data

Aug. 19, 1999 (JP) .......................................... 11-232976

(51) Int. Cl.⁷ ................................................ G03C 5/00
(52) U.S. Cl. ...................... 430/322; 430/313; 430/315; 430/950; 430/331; 430/512; 430/273.1
(58) Field of Search ................................ 430/313, 315, 430/950, 331, 512, 273.1, 322

(56) References Cited

U.S. PATENT DOCUMENTS

| | | | |
|---|---|---|---|
| 4,232,105 A | * 11/1980 | Shinohara et al. | 101/456 |
| 4,451,145 A | * 5/1984 | Fromson et al. | 101/467 |
| 5,635,333 A | * 6/1997 | Petersen et al. | 430/311 |
| 5,658,615 A | 8/1997 | Hasebe et al. | 427/240 |
| 6,132,939 A | * 10/2000 | Ina | 430/271.1 |

* cited by examiner

Primary Examiner—Mark F. Huff
Assistant Examiner—Daborah Chacko-Davis
(74) Attorney, Agent, or Firm—Rader, Fishman & Grauer PLLC

(57) ABSTRACT

A surface-active agent is applied onto a surface to be processed of a wafer, onto which a chemical solution of an antireflection film is applied, thereby forming an antireflection film with the thickness of, for example, about 100 nm. Subsequently, the surface-active agent is applied onto a surface of the antireflection film, onto which a resist solution is applied, thereby forming a resist film with the thickness of, for example, about 500 nm. By applying a coating solution such as the chemical solution of the antireflection film, the resist solution and the like onto the surface-active agent as described above, the surface tension of the coating solution is decreased by the action of the surface-active agent, and the coating solution spreads approximately parallel to the surface of the wafer along the top surface of the wafer. Thus, the required coating amount of the coating solution is reduced, and the amount of the chemical solution can be saved.

5 Claims, 9 Drawing Sheets

RESIST PATTERN FORMING METHOD AND FILM FORMING METHOD

BACKGROUND OF THE INVENTION

1. Field of the Invention

The present invention relates to a film forming method for forming a predetermined resist pattern on a substrate such as, for example, a semiconductor wafer and a glass substrate for a liquid crystal display.

2. Description of the Related Art

In a semiconductor device fabricating procedure, there is a process of forming a resist pattern on a semiconductor wafer (hereinafter called a wafer). In this process, for example, after an antireflection film 11 is formed on a top surface of a wafer W, a resist solution 12 is applied onto a surface of the antireflection film 11. Subsequently, light, an electron beam, an ion beam or the like is emitted onto the resist surface by an exposure section via a mask corresponding to the pattern to perform exposure processing for the coating resist in accordance with a predetermined pattern. Thereafter, by heaping a developing solution on the surface of the coating resist, developing processing is performed, thus forming a predetermined resist mask.

On forming the antireflection film on the wafer W, and on applying the resist solution, the above method adopts a technique of supplying chemical solution of the antireflection film and the resist solution onto a portion close to a center of the wafer top surface, while rotating the wafer W, and spreading these chemical solution and the like on the entire top surface of the wafer by centrifugal force of the rotation.

However, in the conventional method, when the antireflection film and the resist solution are applied, the disadvantage that the required amount of the aforementioned chemical solution and the like increase occurs, and a portion which is not wetted occurs within the surface of the wafer W, which causes the disadvantage of making it impossible to evenly apply the chemical solution and the like.

SUMMARY OF THE INVENTION

An object of the present invention is to provide a resist pattern forming method and a film forming method capable of reducing a coating amount of a coating solution and evenly applying the coating solution onto a substrate.

In order to attain the above object, a fist aspect of the present invention is a resist pattern forming method having the steps of applying a resist solution onto a surface to be processed of a substrate, exposing a film composed of the resist solution with use of a pattern mask, and supplying a developing solution onto the surface to be processed of the substrate to perform development after the exposure, comprising the steps of: applying a solution containing a hydrophilic group onto the surface to be processed of the substrate to make the surface to be processed of the substrate hydrophilic; and applying a coating solution onto the solution containing the hydrophilic group on the substrate. According to the above configuration, the coating solution having hydrophilic nature can be spread all over the top surface of the substrate, and the coating solution can be evenly applied onto the entire top surface of the substrate with the occurrence of a portion left uncoated being prevented.

A second aspect of the present invention is a resist pattern forming method having the steps of applying a resist solution onto a surface to be processed of a substrate, exposing a film composed of the resist solution with use of a pattern mask, and supplying a developing solution onto the surface to be processed of the substrate to perform development after the exposure, comprising the steps of: applying a solution containing a lipophilic group onto the surface to be processed of the substrate to make the surface to be processed of the substrate lipophilic; and applying a coating solution onto the solution containing the lipophilic group on the substrate. According to the above configuration, the coating solution having lipophilic nature can be spread all over the top surface of the substrate, and the coating solution can be evenly applied onto the entire top surface of the substrate with the occurrence of a portion left uncoated being prevented.

A third aspect of the present invention is a film forming method, comprising the steps of: applying a coating solution onto a substrate; and applying a solution for decreasing surface tension of the coating solution onto the substrate before applying the coating solution. According to the above configuration, the coating solution can be spread all over the top surface of the substrate, and the coating solution can be evenly applied onto the entire top surface of the substrate with the occurrence of a portion left uncoated being prevented.

A fourth aspect of the invention is a film forming method, comprising the steps of: applying a solution having a hydrophilic group onto a substrate; and applying a coating solution onto the solution having the hydrophilic group. According to the above configuration, the coating solution having hydrophilic nature can be spread all over the top surface of the substrate, and the coating solution can be evenly applied onto the entire top surface of the substrate with the occurrence of a portion left uncoated being prevented.

A fifth aspect of the present invention is a film forming method, comprising the steps of: applying a solution having a lipophilic group onto a substrate; and applying a coating solution onto the solution having the lipophilic group. According to the above configuration, the coating solution having lipophilic nature can be spread all over the top surface of the substrate, and the coating solution can be evenly applied onto the entire top surface of the substrate with the occurrence of a portion left uncoated being prevented.

A sixth aspect of the present invention is a film forming method, comprising the steps of: applying a surface-active agent onto a substrate; and applying the coating solution onto the surface-active agent. According to the above configuration, the coating solution can be spread all over the top surface of the substrate, and the coating solution can be evenly applied onto the entire top surface of the substrate with the occurrence of a portion left uncoated being prevented.

A seventh aspect of the present invention is a film forming method, comprising the steps of: applying a surface-active agent onto a substrate; and applying the coating solution onto the surface-active agent. According to the above configuration, the surface tension of the coating solution is decreased, the coating solution can be spread all over the top surface of the substrate, and the coating solution can be evenly applied onto the entire top surface of the substrate with the occurrence of a portion left uncoated being prevented.

A eighth aspect of the present invention is a resist pattern forming method, comprising the steps of: applying a first surface-active agent onto a substrate; applying a resist solution onto the first surface-active agent; exposing a film composed of the resist solution with use of a pattern mask; and supplying a developing solution onto the substrate after the exposure. According to the above configuration, the resist solution can be spread all over the top surface of the substrate, and the resist solution can be evenly applied onto the entire top surface of the substrate with the occurrence of a portion left uncoated being prevented.

A ninth aspect of the present invention is a resist pattern forming method, comprising the steps of: applying a mixture of a first surface-active agent and a resist solution onto a substrate; exposing a film composed of the resist solution with use of a pattern mask; and supplying a developing solution onto the substrate to perform development after the exposure. According to the above configuration, the resist solution can be spread all over the top surface of the substrate, and the resist solution can be evenly applied onto the entire top surface of the substrate with the occurrence of a portion left uncoated being prevented.

These objects and still other objects and advantages of the present invention will become apparent upon reading the following specification when taken in conjunction with the accompanying drawings.

DETAILED DESCRIPTION OF THE PREFERRED EMBODIMENTS

An outline of an example of a resist pattern forming method according to the present invention will be explained with reference to FIGS. 1A, 1B, 1C and 1D. The present invention relates to a method of forming an antireflection film and a resist film on a top surface of a wafer W being a substrate, and is a method in which coating solutions such as a chemical solution of the antireflection film, a resist solution and the like are applied after a surface-active agent having a lipophilic group is applied. Consequently, since these coating solutions are lipophilic, near an interface between the surface-active agent and the coating solution, the surface of the film composed of the surface-active agent becomes lipophilic, thus improving wettability of the coating film.

Figure 1A:
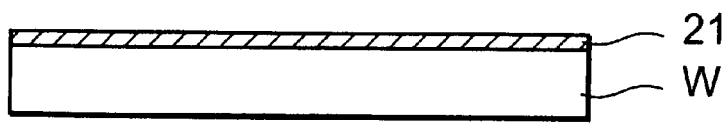
FIGS. 1A, 1B, 1C and 1D are flow diagrams for explaining an embodiment of a method of the present invention.
Figure 1B:
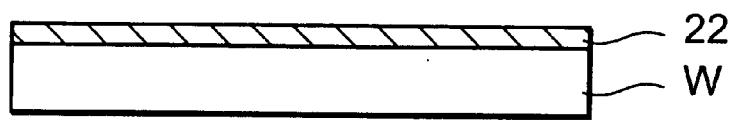

In concrete, as shown in FIG. 1A, a surface to be processed of the wafer W is coated with a surface-active agent 21, and a liquid film of the surface-active agent 21, for example, with the thickness of about 100 nm is formed. Subsequently, as shown in FIG. 1B, the chemical solution of an antireflection film 22 is applied onto the liquid film of the surface-active agent 21 on the wafer, and the antireflection film 22, for example, with the thickness of about 100 nm is formed. The antireflection film 22 is formed to prevent reflection, which occurs underside the resist during exposure in the following process when a chemical amplifying type of resist is used. The antireflection film 22 is composed of, for example, organic substances, and the chemical solution of the antireflection film is a solution in which organic resin is dissolved in an organic solvent.

Figure 1C:
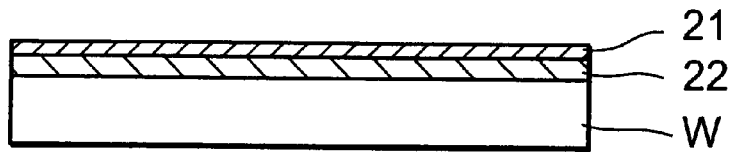
Figure 1D:
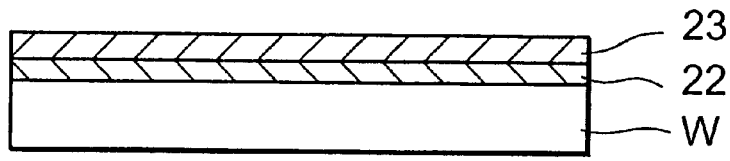

Subsequently, a resist film 23 is formed on the antireflection film 22, and in this occasion, as shown in FIG. 1C, the surface-active agent 21 is applied onto the surface of the antireflection film 22 on the wafer, thereby forming a liquid film of the surface-active agent 21, for example, with the thickness of about 100 nm. Thereafter, as shown in FIG. 1D, the resist solution is applied onto the liquid film of the surface-active agent 21, thereby forming the resist film 23, for example, with the thickness of about 500 nm.

Here, as the surface-active agent, in the case in which a coating solution is applied onto the surface-active agent 21, a solution, which decreases the surface tension of the coating solution, can be used, and an ordinary anionic surface-active agent or a cationic surface-active agent can be used. After such a surface-active agent is applied onto the top surface of the wafer W, when the coating solution such as the resist solution and the chemical solution having a lipophilic group is applied, the coating solution as described above is lipophilic, and therefore the surface of the film composed of the surface-active agent becomes lipophilic near the interface between the film composed of the surface-active agent and the coating film composed of the coating solution, thus decreasing the surface tension of the coating solution. Accordingly, the coating solution can be evenly applied to all over the top surface of the wafer W, and the coating amount of the coating solution can be reduced.

Figure 2:
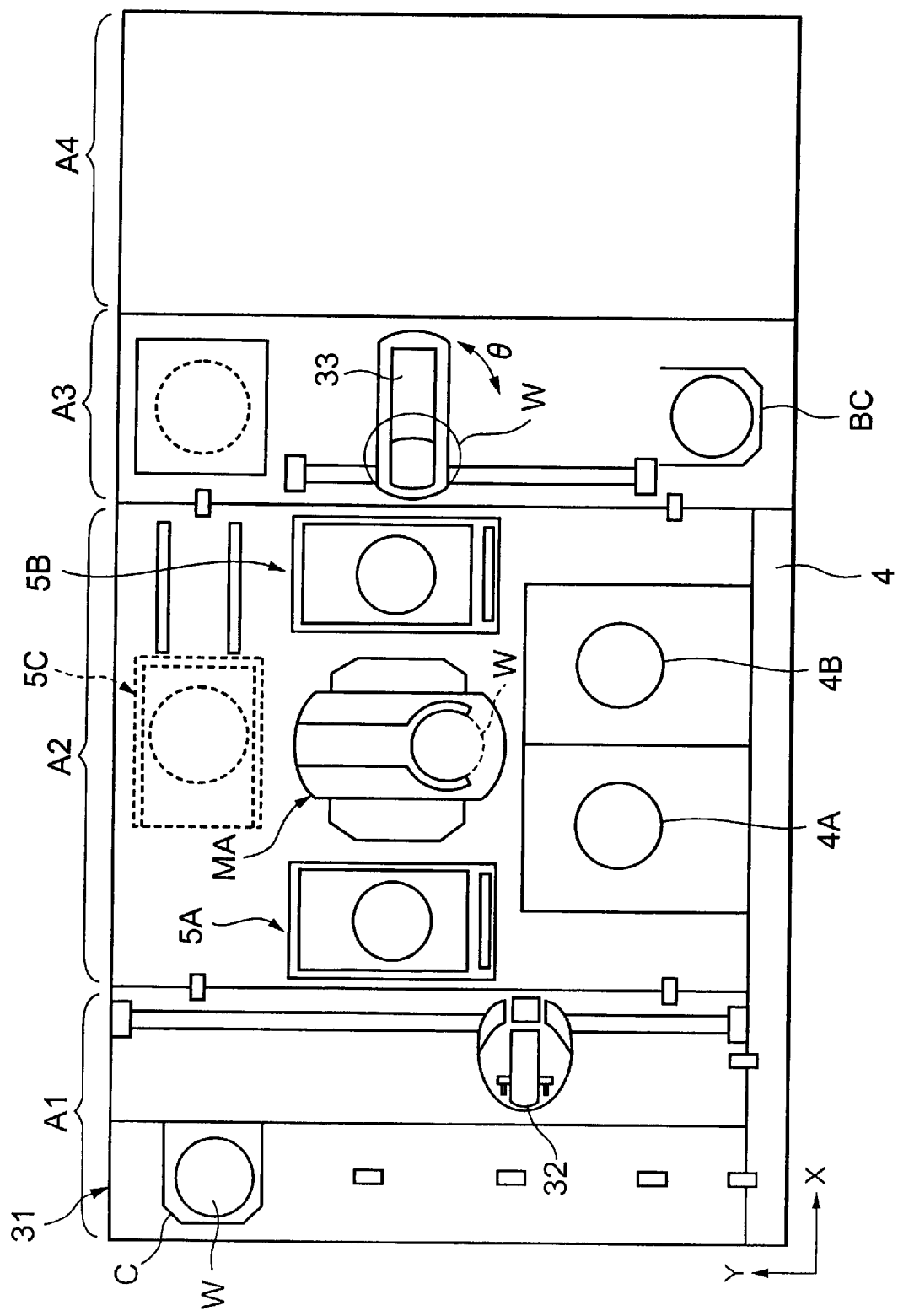
FIG. 2 is a plan view showing an example of a coating and developing apparatus in which the method of the present invention is carried out.
Figure 3:
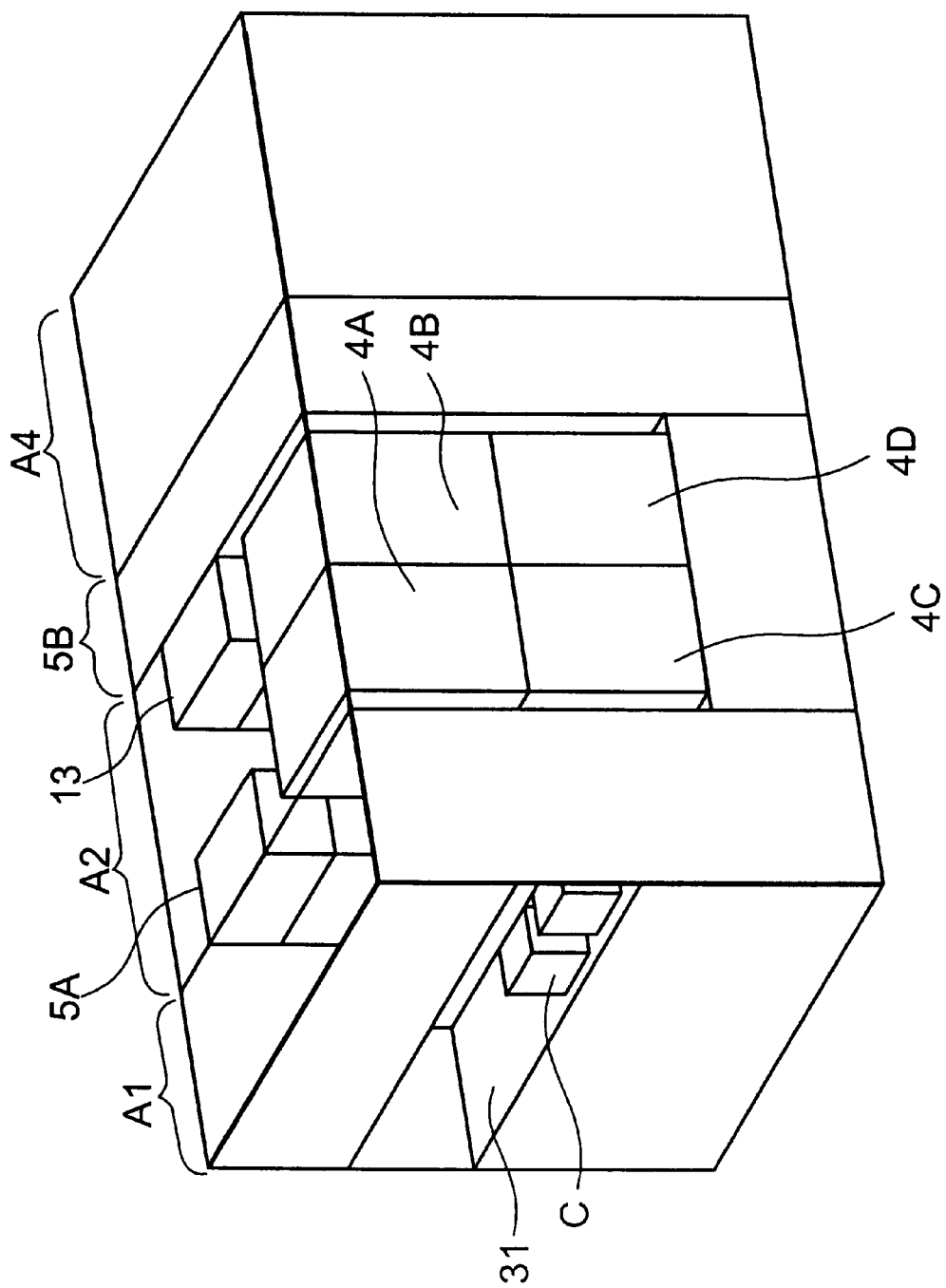
FIG. 3 is a perspective view showing an example of a coating and developing apparatus in which the method of the present invention is carried out.

Subsequently, an example of a coating and developing apparatus used to carry out the method of the present invention will be explained with reference to FIG. 2 and FIG. 3. FIG. 2 is a schematic plan view of the apparatus, and FIG. 3 is a perspective view showing an interior seen through. In FIGS. 2 and 3, A1 denotes a cassette station, which includes a cassette stage 31 on which a wafer cassette C housing a plurality of substrates, for example, 25 of the wafers W is mounted, and a delivery arm 32 for delivering the wafer W to/from the cassette C from/to the cassette stage 31 and a delivery section which will be described later. The delivery arm 32 is structured to be ascendable and descendable, movable in an X direction and a Y direction, and rotatable around a vertical axis.

Adjacently to the cassette station A1, connected is a processing station A2. In the processing station A2, for example, seeing the back from the cassette station A1, a unit 4 for a coating and developing system is provided, for example, on the right, and, for example, three shelf units 5 (5A, 5B, 5C) are respectively placed on the left, toward the front, and in the back. Further, in a center of the station A2, provided is wafer transfer means MA, which will be described later, for having an access to the cassette C, the coating and developing system unit 4 and three shelf units 5 and for delivering the wafer W to/from them, which is structured to be ascendable and descendable, movable laterally and to-and-fro, and rotatable around a vertical axis.

In the unit 4 for the coating and developing system, for example, two developing units 4A and 4B are provided on an upper tier, and an antireflection film forming unit 4C and a coating unit 4D are provided on a lower tier. A mechanism for applying the surface-active agent 21 which will be described later is incorporated in the antireflection film forming unit 4C and the coating unit 4D.

Figure 4:
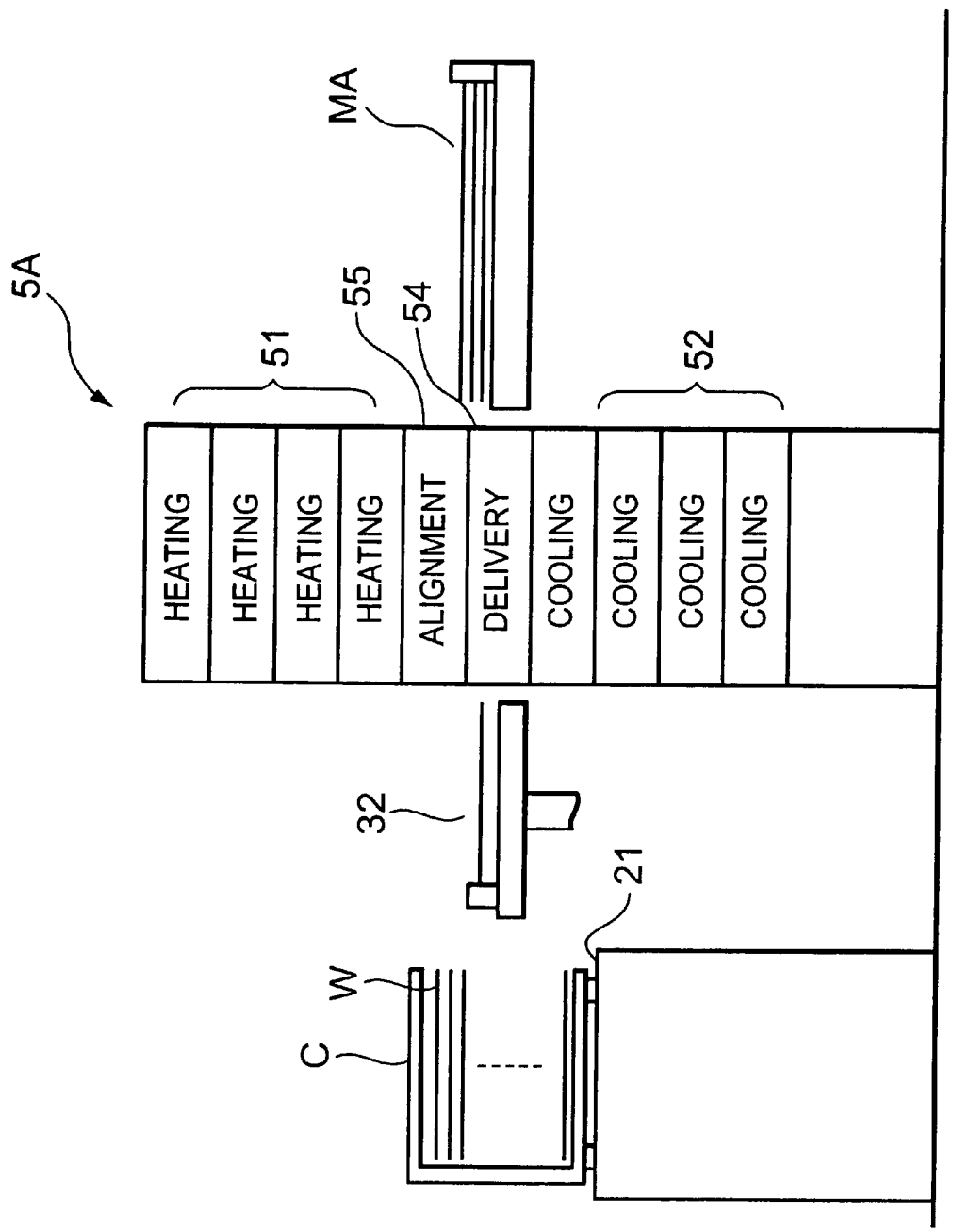
FIG. 4 is a sectional view showing a shelf unit used in carrying out the method of the present invention.

In the shelf unit 5, as the shelf unit 5A is shown in FIG. 4 as a representative example, a heating section 51 for heating the wafer W and a cooling section 52 for cooling the wafer W are vertically arranged, and the shelf units 5A and 5B are each provided with a delivery section 54 including a delivery stage for delivering the wafer W to/from the delivery arm 32 of the cassette station A1 from/to an delivery arm of an interface station A3 which will be described later. An alignment section 55 for aligning the wafer W is provided in the shelf unit 5A. The allocation of the shelf unit 5 shown in FIG. 4 is for convenience in showing an image, and the allocation is not limited thereto.

Adjacently to the above processing station A2, connected is an aligner A4 via the interface station A3. In the interface station A3, provided are, for example, a delivery arm 33 structured to be ascendable and descendable, movable laterally and to-and-fro, and rotatable around an vertical axis for delivering the wafer W to/from the processing station A2 from/to the aligner A4, a buffer cassette BC and the like.

Figure 5A:
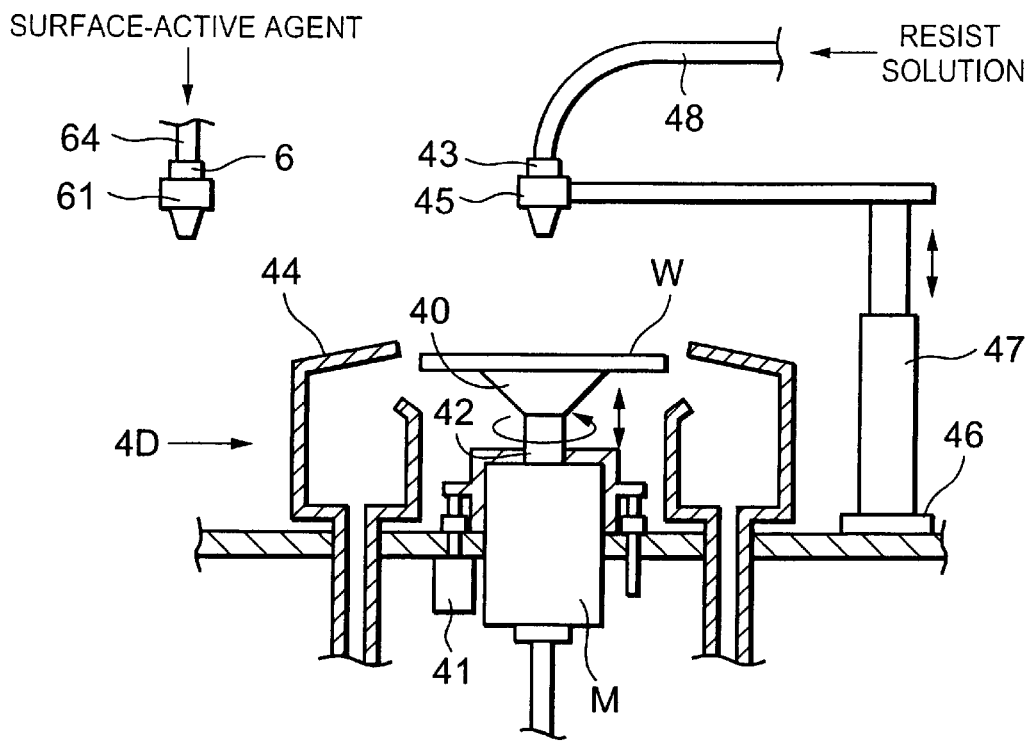
FIGS. 5A and 5B are a sectional view and a plan view showing a coating unit used in carrying out the method of the present invention.
Figure 5B:
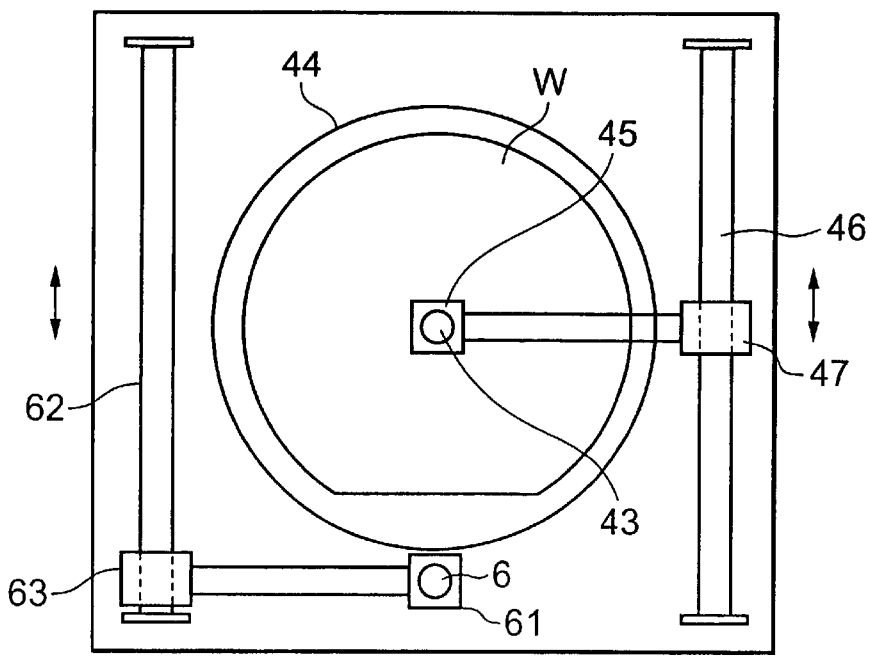

Subsequently, an example of the aforementioned coating unit 4D will be explained with reference to FIGS. 5A and 5B. The coating unit 4D includes a mounting section 40 supported by a motor M, raising and lowering means 41 and a rotating shaft 42 to be rotatable, and ascendable and descendable, and having, for example, a vacuum-suction function, a nozzle 43 for dropping a coating solution onto the top surface of the wafer W vacuum-sucked by the mounting section 40, a cup 44 for surrounding the wafer W sucked by the mounting section 40 and preventing the coating solution from spraying on the surroundings when the coating solution supplied onto the wafer W is shaken off, and a surface-active agent nozzle 6 for dropping the surface-active agent 21 on the top surface of the wafer W which is vacuum-sucked by the mounting section 40. Numeral 45 in FIG. 5B denotes a drain passage.

The nozzle 43 and the surface-active agent nozzle 6 are respectively held by, for example, nozzle holding sections 45 and 61, and are constructed to be horizontally movable along guide rails 46 and 61, and to be ascendable and descendable by raising and lowering mechanisms 47 and 63. Thus, the nozzle 43 and the surface-active agent nozzle 6 are movable between a standby position outside the mounting section 40 (in this example, in FIG. 5B, the nozzle 43 is on standby at the top side of the wafer W on the paper surface, and the surface-active agent nozzle 6 is on standby at the other side), and the position above approximately a center portion of the wafer W held by the mounting section 40, and they are also ascendable and descendable between the position above approximately the center portion of the wafer W and a supply position for the coating solutions and the surface-active agent 21, which is the position lower than the above position. The above nozzles 43 and 6 are respectively connected and communicated with a coating solution storage tank and a surface-active agent storage tank not illustrated via supply lines 48 and 64. It should be noted that in FIG. 5A, the position of the surface-active agent nozzle 6 shown therein is illustrated by being displaced for convenience.

Though the developing units 4A and 4B, and the antireflection film forming unit 4C have approximately the same configuration as that of the coating unit 4D, the developing units 4A and 4B are constructed so that the nozzle 43 includes a number of supply apertures arranged, for example, in a diameter direction of the wafer W, whereby the developing solution is discharged from the nozzle 43 onto the top surface of the wafer W on the mounting section 40, and the developing solution is heaped on the wafer W by rotating the wafer W 180 degrees, thus forming a liquid film of the developing solution.

Figure 6:
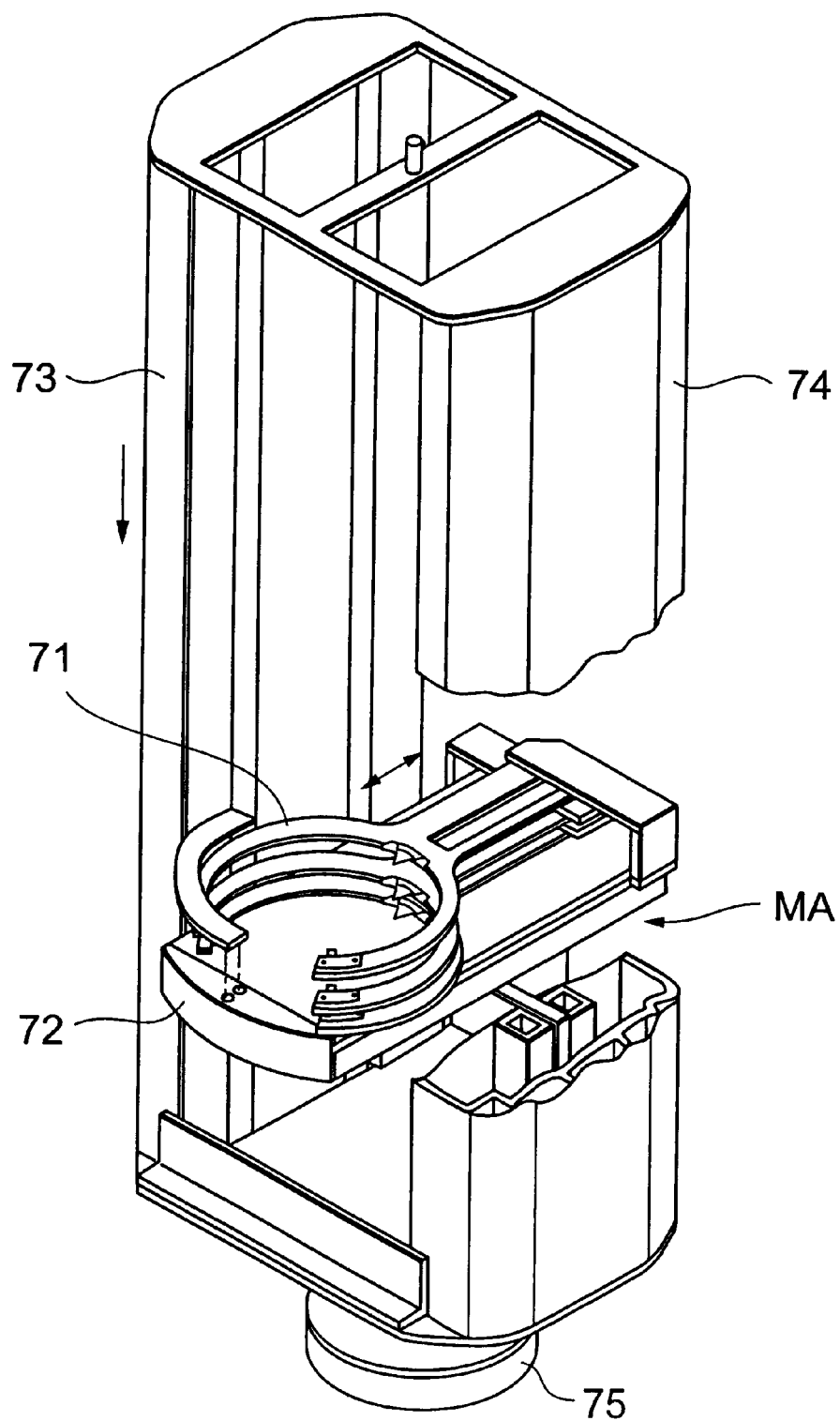
FIG. 6 is a perspective view showing wafer transfer means used in carrying out the method of the present invention.

The wafer transfer means MA includes an arm 71 constructed to be, for example, three-tiered for holding the wafer W as shown in FIG. 6, and the arm 71 is supported by a base table 72 to freely advance and retreat. The base table 72 is constructed to be ascendable and descendable along guide rails 73 and 74, which are connected to each other at the upper ends and the lower ends respectively, and which are constructed to be rotatable around a vertical axis by a rotational drive section 75. Thus the arm 71 is structured to be, for example, ascendable and descendable, and rotatable around the vertical axis, and to freely advance and retreat.

Subsequently, the method of the present invention carried out in the aforementioned apparatus will be explained. Initially, the cassette C housing, for example, 25 of the wafers W is carried in the cassette stage 31 by an automatic carrier robot or an operator, and the wafer W is taken out of the cassette C to be placed in the delivery section 54 of the shelf unit 5A of the processing station A2 by the delivery arm 32. After the wafer W is initially cooled at a predetermined temperature in the cooling section 52 of the shelf unit 5, it is transferred to the antireflection film forming unit 4C, where the antireflection film 22 is formed. The wafer W with the antireflection film 22 being formed thereon as described above is then heated to a predetermined temperature in the heating section 51 of the shelf unit 5, and then after being cooled to a predetermined temperature in the cooling section 52, it is transferred to the coating unit 4D, where the resist film 23 is formed.

Figure 7A:
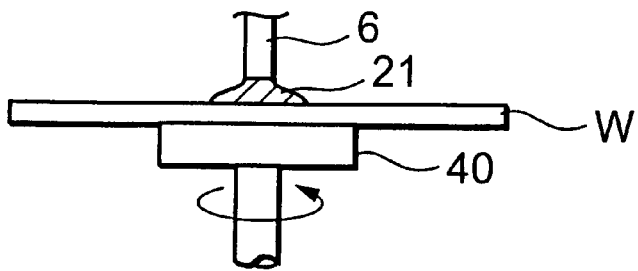
FIGS. 7A, 7B, 7C and 7D are flow diagrams showing a part of one embodiment of the method of the present invention.
Figure 7B:
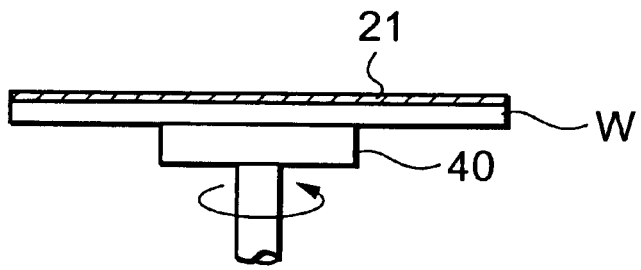

Here, the processes of forming the antireflection film 22 and the resist film 23 will be explained based on FIG. 7 with the resist film 23 being a representative example. Initially, while the wafer W is suction-held by the mounting section 40 of the coating unit 4D, the surface-active agent nozzle 6 is moved from the standby position to the supply position. For example, as shown in FIG. 7A, while the wafer W is rotated by the mounting section 40, the surface-active agent being the surface-active agent 21 is dropped onto an area close to approximately the center of the wafer top surface. In this manner, the surface-active agent 21 spreads over the entire top surface of the wafer W by the centrifugal force of the rotation of the wafer W. Here, the surface-active agent is absorbed in the top surface of the wafer W due to its nature, the entire top surface of the wafer W is in a state in which the thin film with the thickness of 50 nm to 100 nm, in this situation, the thickness of, for example, about 100 nm, is thoroughly formed thereon(See FIG. 7B).

Figure 7C:
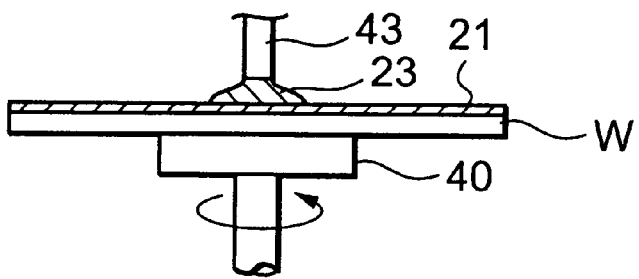
Figure 7D:
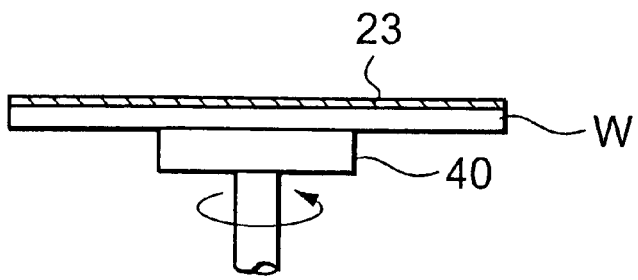

Next, for example, as shown in FIG. 7C, while the surface-active agent nozzle 6 is moved to the standby position, the nozzle 43 is moved from the standby position to the supply position, and while the wafer W is rotated by the mounting section 40, the resist solution is dropped onto the area close to approximately the center of the wafer top surface. In this manner, the resist solution spreads over the wafer in a state in which it is mixed with the surface-active agent 21 on the wafer top surface by the centrifugal force caused by the rotation of the wafer W to spread over the entire top surface of the wafer W. In this situation, as described above, near the interface between the lipophilic resist solution and the film composed of the surface-active agent, the surface of the film composed of the surface-active agent becomes lipophilic, thus forming the resist film 23 with the thickness of 10 nm to 2000 nm, for example, in this situation with the thickness of about 500 nm, all over the top surface of the wafer W (See FIG. 7D).

The antireflection film 22 is formed in the same manner as the aforementioned resist film 23 is formed. Specifically, after the liquid film of the surface-active agent 21 with the thickness of 50 nm to 100 nm, in this situation with the thickness of, for example, about 100 nm, is formed on the wafer top surface, the chemical solution of the antireflection film 22 is applied. As a result, near the interface between the lipophilic chemical solution of the antireflection film 22 and the film composed of the surface-active agent, the surface of the film composed of the surface-active agent becomes lipophilic, thus forming the antireflection film 22 with the thickness of 70 nm to 100 nm, in this situation with the thickness of, for example, about 100 nm, all over the top surface of the wafer W.

Though in this situation, the resist film 23 and the antireflection film 22 are mixtures of the resist solution with the surface-active agent 21, and the chemical solution of the antireflection film with the surface-active agent 21, the amount of the surface-active agent is extremely small compared with those of the resist solution and the chemical solution of the antireflection film 22, and therefore it does not have an adverse effect on the film quality of the resist film 23 and the antireflection film 22.

The wafer W on which the resist film 23 is thus formed is heated to a predetermined temperature in the heating section 51 of the shelf unit 5. Subsequently, after the wafer W is cooled to a predetermined temperature in the cooling section 52, it is transferred by the route of the delivery section 54 of the shelf unit 5B→the delivery arm 33 of the interface station A3→the aligner A4, and the exposure is performed in the aligner A4.

The wafer W after the exposure is sent to the processing station A2 by the reverse route, and is heated to a predetermined temperature in the heating section 51 of the shelf unit 5. Subsequently, after the wafer W is cooled to a predetermined temperature in the cooling section 52, the developing solution is supplied onto the wafer top surface and the development is performed in the developing units 4A and 4B, thus forming a predetermined resist pattern on a circuit forming area of the wafer W. Thereafter, the wafer W is returned, for example, into the original cassette C via the delivery section 54 of the shelf unit 5A.

Here, the cooling of the wafer W before the formation of the antireflection film 22, and the heating and cooling of the wafer W before the formation of the resist film 23 and before the exposure and the development are performed so that the temperature of the wafer W is adjusted at a temperature suitable for each processing such as the formation of the antireflection film 22 and the resist film 23, the exposure, and the development. The wafer W is transferred inside the processing station A2 by means of the wafer transferring means MA.

In the above method, the liquid film of the surface-active agent 21 having a lipophilic group is formed on the top surface of the wafer W, and the coating solution such as the chemical solution of the antireflection film 22, the resist solution and the like having a lipohpilic group are applied thereon, whereby the antireflection film 22 and the resist film 23 are formed, therefore making it possible to reduce the amount of the coating solution, prevent every portion from being left uncoated, thereby making it possible to evenly apply these coating solutions onto the substrate and increasing the uniformity of the processing.

Figure 8A:
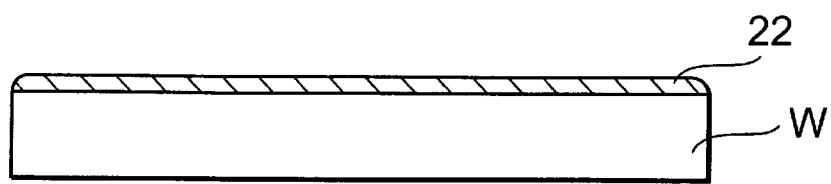
FIGS. 8A and 8B are sectional views for explaining an operation of the method of the present invention.
Figure 8B:
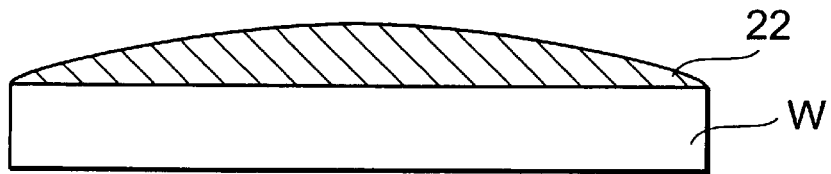

Specifically, after forming the liquid film of the surface-active agent 21 on the top surface of the wafer W by applying the lipophilic coating solution, the surface of the film composed of the surface-active agent becomes lipophilic and has large surface activity to the lipophilic coating solution. Thus the surface tension of the coating solution decreases, and the coating solution spreads approximately parallel to the surface of the wafer W along the top surface of the wafer W, as the chemical solution of the antireflection film 22 is shown in FIG. 8A as a representative example. Since the coating solution spreads all over the top surface of the wafer W while mixing with the surface-active agent 21, the coating solution can be evenly applied onto the entire top surface of the wafer with the occurrence of a portion left uncoated being prevented. On the other hand, when the coating solution such as the chemical solution of the antireflection film 22 and the like is directly dropped onto the top surface of the wafer W, the surface of the coating solution becomes spherical to be made as small as possible by the surface tension of the coating solution, and thus as shown in FIG. 8B, the coating solution spreads in the state in which it is swelled on the top surface of the wafer W.

Generally, it is known that the coating amount decreases as the surface tension of the coating solution decreases. Thus, when the coating solution is applied onto the entire top surface of the wafer, the required coating amount of the coating solution reduces in the case with the small surface tension as shown in FIG. 8A than in the case with the large surface tension as shown in FIG. 8B, and thus the required amount of the coating solution can be reduced, thereby making it possible to reduce the amount of the coating solution.

Actually, when the antireflection film 22 and the resist film 23 are formed by the aforementioned method, it is confirmed that the coating amounts of the chemical solution of the antireflection film 22 and the resist solution can be reduced compared with the conventional method. Further, as for the formation state of the antireflection film 22 and the resist film 23, when uneven coating is checked by means of a surface inspection lamp and uniformity of the film thickness is checked by means of a film thickness measuring device, an uncoated portion is not found, and it is confirmed that the coating is applied with the film thickness being uniform.

In the above, in the present invention, as for the substrate, it is not limited to a wafer, but it may be a glass substrate for a liquid crystal display.

Further, the method of the present invention may be applied to the developing process. For example, the liquid film of the surface-active agent 21 having a hydrophilic group with the thickness of, for example, about 100 nm may be formed on the top surface of the wafer W after exposure, and subsequently, the hydrophilic developing solution may be heaped thereon, thus performing the development of the wafer top surface. In this case, after the liquid film of the surface-active agent 21 having a hydrophilic group is formed, the hydrophilic developing solution is applied, and thereby the surface of the film composed of the surface-active agent becomes hydrophilic to have large surface activity to the hydrophilic developing solution near the interface between the developing solution and the film composed of the surface-active agent. As a result, the surface tension of the developing solution decreases, thus making it possible to reduce the amount of the developing solution and to evenly apply the developing solution with no portion being left uncoated. Further, since the developing solution is supplied onto the liquid film of the surface-active agent 21 on the wafer, the initial impact caused when the developing solution hits against the wafer top surface can be decreased, and the advantage that an imperfection in the development can be reduced can be obtained.

It may be suitable to use the method of the present invention only in the formation of the antireflection film 22, or only in the formation of the resist film 23, or only in the development. Further, the mixture of the surface-active agent 21 and the solvent of the coating solution may be applied onto the substrate, but in the case in which the coating solution is applied after the surface-active agent is previously applied, the surface-active agent can be applied with more optimal film thickness corresponding to the base form. When the coating amount of the surface-active agent is changed according to the base form, in the case in which the processing solution is formed by mixing the surface-active agent and the coating solution, it is necessary to perform a changing operation of the processing solution and to prepare the surface-active agent once again, and thus loss of time or the like occurs when the processing solution is changed. On the other hand, in the case in which the surface-active agent and the coating solution are separately applied, it is suitable to only change the parameters of the rotational speed of the wafer and the discharge amount of the surface-active agent, thus making it possible to perform the processing without loss of time. In addition, when they are separately applied, a mixing operation of the coating solution and the solvent, and a stirring operation are not required.

Figure 9A:
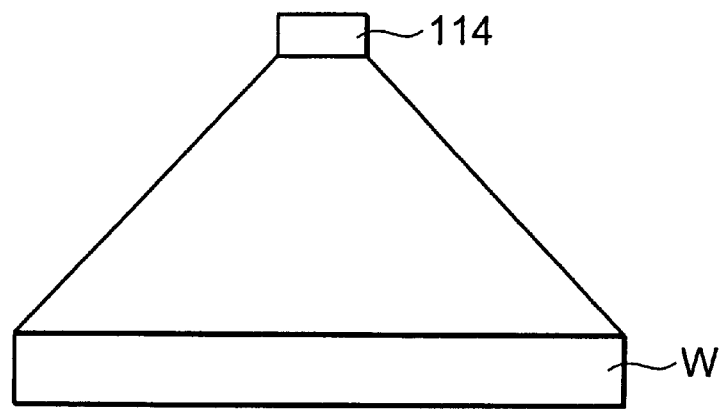
FIGS. 9A and 9B are views for explaining another embodiment of the method of the present invention.
Figure 9B:
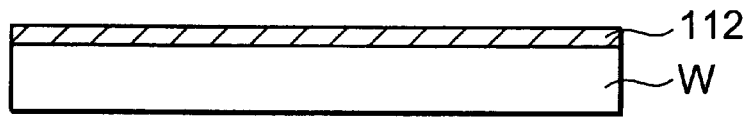

In addition, in the aforementioned embodiment, the surface tension of the coating solution is decreased by applying the surface-tension agent before the coating solution is applied, however, the surface tension of the coating solution can be decreased by emitting ultraviolet light onto the wafer W before the coating solution is applied. As shown in FIG. 9A, ultraviolet light is emitted to the surface to be processed of the wafer W from a ultraviolet light emitting section 114. Thereafter, as shown in FIG. 9B, a coating solution 112 is applied onto the surface to be processed of the wafer W. The surface tension of the coating solution is decreased by the emission of the ultraviolet light, and the amount of the coating solution can be reduced, and the coating solution can be evenly applied with no portion being left uncoated. As for the coating solution, all the solutions such as the antireflection film, resist solution, the developing solution and the like can be used.

According to the present embodiment, since the portion especially requiring the activator is only the top surface of the wafer W, waste is avoided compared with the method in which the activator is mixed into the entire coating solution to be applied only to the top surface of the wafer W. In addition, when the activator is previously applied onto the top surface of the wafer W and especially when its surface becomes lipophilic, an imperfection, which occurs as a result that the top surface of the wafer W includes a trace amount of air during the coating, can be reduced.

The aforementioned embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A resist-pattern forming method comprising the steps of:

forming a first liquid film of a surface-active agent on a semiconductor substrate;

forming an antireflection film on the first liquid film of the surface-active agent;

forming a second liquid film of the surface-active agent on the antireflection film;

forming a resist film of a chemical amplifying type on the second liquid film of the surface-active agent;

exposing the resist film to light through a pattern mask; and supplying a developing solution on the exposed resist film to form a resist pattern thereon.

2. The resist-pattern forming method according to claim 1, wherein the surface-active agent includes a lipophilic group.

3. The resist-pattern forming method according to claim 1, wherein the surface-active agent is an anionic surface-active agent.

4. The resist-pattern forming method according to claim 1, wherein the surface-active agent is a cationic surface-active agent.

5. The resist-pattern forming method according to claim 1, wherein the antireflection film includes organic substances.

* * * * *